US000001176H

United States Statutory Invention Registration [19]

[11] Reg. Number: H1176

Schwoerer [43] Published: Apr. 6, 1993

[54] BIT DISPERSEMENT METHOD FOR ENHANCED SEC-DED ERROR DETECTION AND CORRECTION IN MULTI-BIT MEMORY DEVICES

[75] Inventor: Gerald A. Schwoerer, Chippewa Falls, Wis.

[73] Assignee: Cray Research, Inc., Minneapolis, Minn.

[21] Appl. No.: 400,071

[22] Filed: Aug. 30, 1989

[51] Int. Cl.[5] ..... G11C 29/00

[52] U.S. Cl. ..... 371/2.2; 365/200

[58] Field of Search ..... 371/2.1, 2.2, 40.1

[56] References Cited

U.S. PATENT DOCUMENTS

| | | | |
|---|---|---|---|
| 3,812,336 | 5/1974 | Bossen et al. | 371/2.2 |
| 4,006,467 | 2/1977 | Bowman | 371/2.2 |
| 4,485,471 | 11/1984 | Singh et al. | 371/2.2 |
| 4,488,298 | 12/1984 | Bond et al. | 371/2.2 |
| 4,489,403 | 12/1984 | Bond | 371/2.2 |
| 4,506,364 | 3/1985 | Aichelmann, Jr. et al. | 371/2.2 |
| 4,584,682 | 4/1986 | Shah et al. | 371/10.1 |
| 4,802,170 | 1/1989 | Trottier | 371/2.2 |
| 4,835,627 | 5/1989 | Endo et al. | 371/2.1 |

OTHER PUBLICATIONS

Singh et al., Word Line, Bit Line Address Interchanging to Enhance Memory Fault Tolerance, IBM Tech. Discl. Bulletin, vol. 26, No. 6, Nov. 1983, pp. 2747-2748.

Franco, Coding for Error-Free Communications, Electro-Technology, Jan. 1968, FIG. 7.

*Primary Examiner*—Bernarr E. Gregory

*Attorney, Agent, or Firm*—Merchant, Gould, Smith, Edell, Welter & Schmidt

[57] ABSTRACT

Improved error detection and correction is obtained in computers of the type possessing multi-bit memory devices. The error detection involves dispersing the bits from each multi-bit memory device in such a way that a SEC-DED codeword can detect when the multi-bit memory device fails.

1 Claim, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

BIT DISPERSEMENT METHOD FOR ENHANCED SEC-DED ERROR DETECTION AND CORRECTION IN MULTI-BIT MEMORY DEVICES

FIELD OF THE INVENTION

This invention relates generally to methods of error detection and correction for computer systems. In particular, is directed to a method of detecting failures in multi-bit memory devices using SEC-DED (Single Error Correction—Double Error Detection) codewords.

BACKGROUND OF THE INVENTION

Many computer companies use an error detection and correction scheme based on the SEC-DED method. The SEC-DED method of error detection and correction is capable of detecting two bits in error and correcting one bit in error. The number of bits in error is dependent on the type of failure that occurs. For example, the failure of a single memory cell would cause only a single bit error, while the failure of a multi-bit memory device would cause multi-bit errors. It is readily recognized in the art that the SEC-DED method is most effective in those memory organizations that use single bit memory devices. Thus, the failure of a memory device corrupts at most one bit position in a data word.

SUMMARY OF THE INVENTION

To overcome the limitations in the prior art described above, and to overcome other limitations that will become apparent upon reading and understanding the present specification, the present invention discloses a method of detecting multi-bit errors using SEC-DED codewords when the multi-bit memory devices are $<4$ bits wide. The bits from each memory device are dispersed into separate bytes of the codeword. The dispersal involves regrouping or rewiring the bit positions from each multi-bit memory device. Such dispersal permits the SEC-DED codeword to detect the multi-bit errors that occur when the multi-bit memory device fails.

DETAILED DESCRIPTION OF THE PREFERRED EMBODIMENT

Figures 1A, 1B, 1C, 1D:
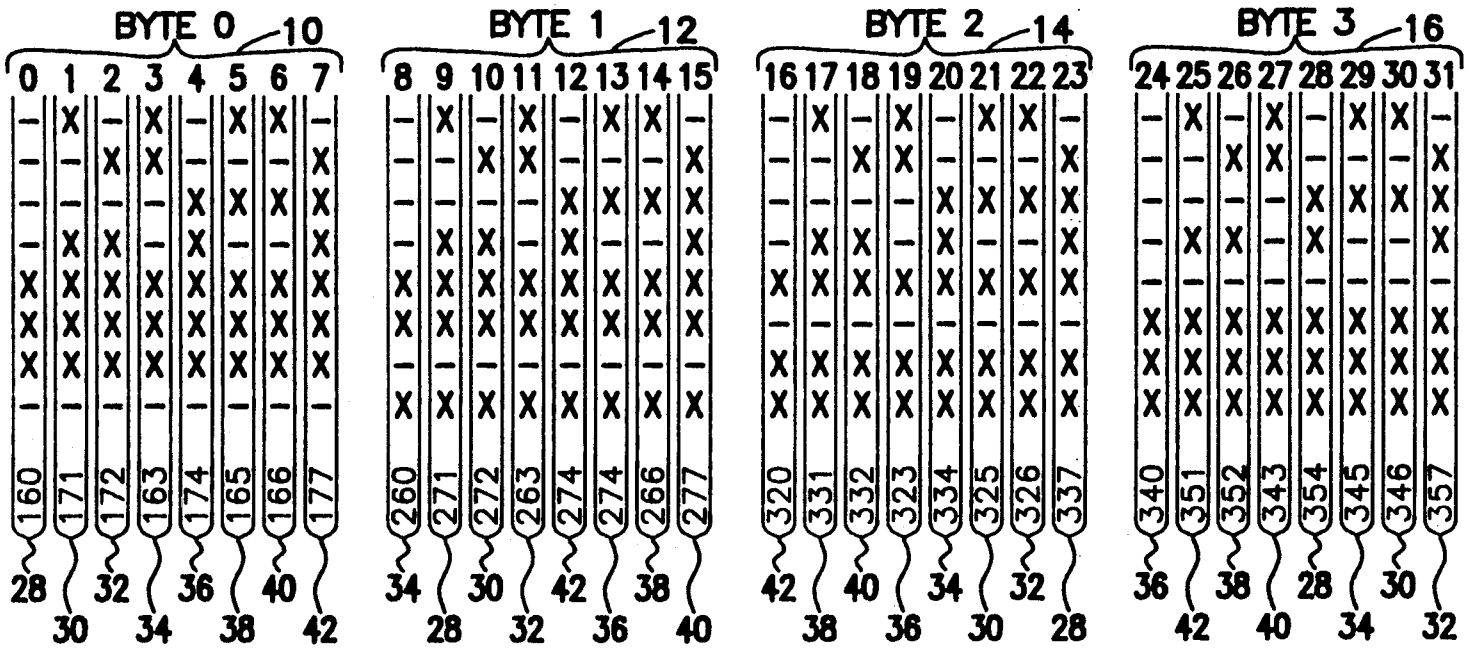
FIGS 1A–FIG. 1I, herein after collectively referred to as FIG. 1, show a (72,64) coding matrix and bit dispersement pattern used to detect multi-bit memory device failures.

In the following Detailed Description of the Preferred Embodiment, reference is made to the Drawing which forms a part hereof, and in which is shown by way of illustration a specific embodiment in which the invention may be practiced. It is to be understood that other embodiments may be utilized and structural changes may be made without departing from the scope of the present invention.

The present invention discloses a method of detecting multi-bit errors using a SEC-DED coding method when the multi-bit memory devices are $\leqq 4$ bits wide. The method comprises dispersing bits from each multi-bit memory device into separate bytes of the codeword. Such dispersal permits the SEC-DED codeword to detect multi-bit errors. The dispersal involves regrouping or rewiring the bit positions from each multi-bit memory device. One advantage of the present invention is that the same SEC-DED encoding and decoding hardware can be used as with standard SEC-DEDs.

Figures 1E, 1F, 1G, 1H, 1I:
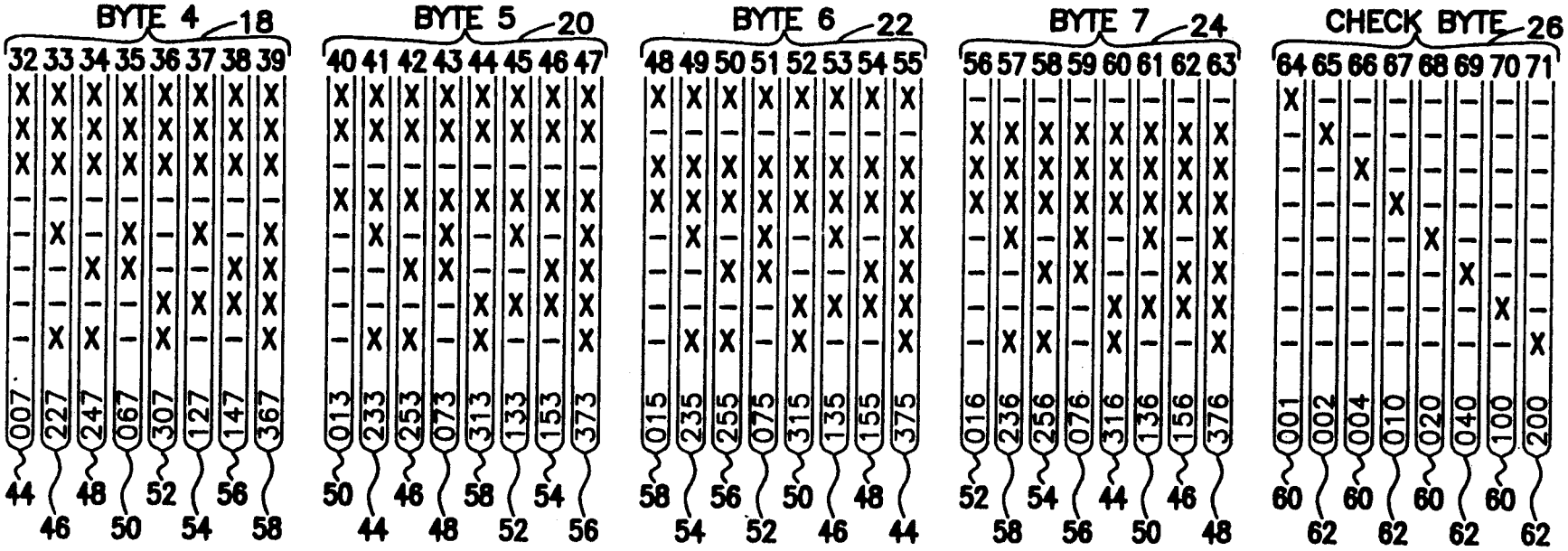

SEC-DEDs are linear block codes. A (n,k) linear block code is a k-dimensional subspace of a binary n-dimensional vector space. This vector space is called a codeword. An n-bit codeword contains k data bits and $r=n-k$ check bits. An r x n parity check matrix H is used to describe the code. FIG. 1 shows a binary (72,64) linear block code used in the preferred embodiment wherein $n=72$, $k=64$, and $r=8$.

Memory devices store the codewords for later retrieval. If $V=(v_1, v_2, \ldots, v_n)$ is an n-bit vector, then V is a codeword if and only if $H\times V'=0$, where V' denotes the transpose of V, and all additions are performed modulo 2.

The encoding process for codewords consists of generating r check bits for every k data bits. In the preferred embodiment, the encoding process of a codeword consists of generating 8 check bits for a set of 64 data bits. To facilitate encoding, the H matrix is expressed as $H=[P, I_r]$, where P is a $r\times k$ binary matrix and $I_r$ is the $r\times r$ identity matrix. The first k bits of a codeword are the data bits and the last r bits are the check bits. The ith check bit can be calculated from the ith equation of the set of r equations in $H\times V'=0$.

In the preferred embodiment, the H matrix is illustrated in FIG. 1 where P is an $8\times 64$ binary matrix comprised of $8\times 8$ submatrices 10-24 and $I_r$ is the $8\times 8$ identity matrix 26. The "X" characters in the H matrix represent "1" bits for the SEC-DED coding method and the "–" characters in the H matrix represent "0" bits for the SEC-DED coding method.

A codeword retrieved from memory may be corrupted. If $U=(u_1, u_2, \ldots, u_n)$ is the codeword retrieved from memory, then the decoding process calculates an r-bit syndrome $S=H\times U'$. In FIG. 1, the octal syndrome values for the H matrix are written vertically at the bottom of each column.

An algorithm for correcting single errors and detecting multiple errors first determines whether S is zero. If S is zero, then the codeword is assumed to be error-free. If S is not zero, then a match is attempted for S and a column of the H matrix. If S is the same as the ith column of H, then the ith bit of the codeword is in error. If S is not equal to any column of H, then the errors detected are uncorrectable. When applied to a SEC-DED codeword, this algorithm corrects all single errors and detects all double errors.

Multi-bit errors may not be detected or may be falsely corrected. The extent of multiple errors detected depends on the structure of the codeword.

The failure of a multi-bit memory device may result in an all "1" bits or an all "0" bits pattern. Experience has shown that these particular patterns are more likely not to be detected by a SEC-DED codeword.

Multi-bit errors can be detected by Single Error Correction—Double Error Detection—Single Byte Detection (SEC-DED-SBD) codewords when the number of bits in error is less than or equal to four. Most SEC-DED codewords can be reconfigured as SEC-DED-SBD codewords to detect single-byte errors. The reconfiguration involves the regrouping or rewiring of the bit positions of the original code. Since the same encoding and decoding hardware can be used, no additional hardware is required to reconfigure a SEC-DED codeword for single-byte error detection.

FIG. 1 illustrates the bit dispersal method of the present invention. In FIG. 1, each column of the H matrix is labeled with a reference number which indicates which 4-bit wide memory device stores the corresponding bit of the codeword. Thus, each bit from a 4-bit wide memory device is dispersed to a different byte of the codeword.

In the preferred embodiment, the bit dispersal pattern comprises: bits 0, 9, 23, and 28 from a first 4-bit wide memory device 28; bits 1, 10, 21, and 30 from a second 4-bit wide memory device 30; bits 2, 11, 22, and 31 from a third 4-bit wide memory device 32; bits 3, 8, 20, and 29 from a fourth 4-bit wide memory device 34; bits 4, 13, 19, and 24 from a fifth 4-bit wide memory device 36; bits 5, 14, 17, and 26 from a sixth 4-bit wide memory device 38; bits 6, 15, 18, and 27 from a seventh 4-bit wide memory device 40; bits 7, 12, 16, and 25 from a eighth 4-bit wide memory device 42; bits 32, 41, 55, and 60 from a ninth 4-bit wide memory device 44; bits 33, 42, 53, and 62 from a tenth 4-bit wide memory device 46; bits 34, 43, 54, and 63 from an eleventh 4-bit wide memory device 48; bits 35, 40, 52, and 61 from an twelfth 4-bit wide memory device 50; bits 36, 45, 51, and 56 from an thirteenth 4-bit wide memory device 52; bits 37, 46, 49, and 58 from an fourteenth 4-bit wide memory device 54; bits 38, 47, 50, and 59 from an fifteenth 4-bit wide memory device 56; bits 39, 44, 48, and 57 from an sixteenth 4-bit wide memory device 58; bits 64, 66, 68, and 70 from an seventeenth 4-bit wide memory device 60; bits 65, 67, 69, and 71 from an eighteenth 4-bit wide memory device 62.

Those skilled in the art will readily recognize that any bit dispersal pattern calculated to achieve the same result may be used. In the preferred embodiment, the bits are dispersed so that none of the bits from a multi-bit memory device share the same byte of the codeword. Only the check bits in the check byte share two memory devices between the eight bits thereof.

Although a specific configuration of bits has been illustrated herein, it will be appreciated by those in ordinary skill in the art that any arrangement of bits which is calculated to achieve the same purpose may be substituted for the specific arrangement shown. Thus, the present invention disclosed herein may be implemented through the use of different bit arrangements, different length data words, and different length codewords. This application is intended to cover any adaptations or variations thereof. Therefore, it is manifestly intended that this invention be limited only by the claims and the equivalence thereof.

What is claimed is:

1. A method of detecting multi-bit errors in a computer, comprising:

(a) constructing a SEC-DED codeword such that said SEC-DED codeword can correct one bit in error and detect two bits in error; and (b) dispersing a plurality of bits from a plurality of multi-bit memory devices throughout said SEC-DED codeword such that a syndrome calculated from said SEC-DED codeword can detect when one of said multi-bit memory devices has failed.

* * * * *